(12) United States Patent
Gau et al.

(10) Patent No.: US 6,905,935 B1
(45) Date of Patent: Jun. 14, 2005

(54) METHOD FOR FABRICATING A VERTICAL BIPOLAR JUNCTION TRANSISTOR

(75) Inventors: Jing-Horng Gau, Hsin-Chu Hsien (TW); Anchor Chen, Hsin-Chu (TW)

(73) Assignee: United Microelectronics Corp., Hsin-Chu (TW)

(*) Notice: Subject to any disclaimer, the term of this patent is extended or adjusted under 35 U.S.C. 154(b) by 0 days.

(21) Appl. No.: 10/707,260

(22) Filed: Dec. 2, 2003

(51) Int. Cl.[7] .............................................. H01L 21/331
(52) U.S. Cl. ...................................... 438/370; 257/592
(58) Field of Search .......................... 438/336, 369–377, 438/341, 481; 257/583, 592

(56) References Cited

U.S. PATENT DOCUMENTS 4,883,772 A * 11/1989 Cleeves et al. ............. 438/369
4,916,083 A * 4/1990 Monkowski et al. ....... 438/367

* cited by examiner

Primary Examiner—David Nelms
Assistant Examiner—Calvin Lee
(74) Attorney, Agent, or Firm—Winston Hsu

(57) ABSTRACT

A semiconductor wafer includes a first doping region of a first conductivity type, a second doping region of a second conductivity type, and a plurality of isolated structures positioned on surfaces of the first doping region and the second doping region. A third doping region of the first conductivity type is formed in an upper portion of the second doping region. A shielding layer is formed and a portion of the shielding layer is removed to form an opening shielding layer to expose a portion of the third doping region. Subsequently, a doping layer of the second conductivity type is formed on a surface of the third doping region. A self-aligned silicidation process is performed to form a silicide layer on the surfaces of the second doping region, the third doping region and the doping layer, the silicide layer functioning as a contact region of a vertical bipolar junction transistor.

20 Claims, 17 Drawing Sheets

US 6,905,935 B1

METHOD FOR FABRICATING A VERTICAL BIPOLAR JUNCTION TRANSISTOR

BACKGROUND OF INVENTION

1. Field of the Invention

The present invention relates to a method for fabricating a vertical bipolar junction transistor, and more particularly, to a method for forming a contact region of a vertical bipolar junction transistor by a self-aligned silicidation process (salicide).

2. Description of the Prior Art

Bipolar junction transistors are important elements of a semiconductor. In general, there are two types of bipolar junction transistors: a lateral bipolar junction transistor and a vertical bipolar junction transistor.

FIG. 1 shows a method for fabricating a vertical bipolar junction transistor according to the prior art. Referring to FIG. 1, a vertical bipolar transistor is shown on a semiconductor wafer 100 having a P-type substrate 110. An N-type buried layer 113 is formed on an upper portion of the P-type substrate 110. A P-type epitaxial layer 115 functioning as a collector region of the vertical bipolar junction transistor has been grown on the P-type substrate 110 having the N-type buried layer 113. At least one N-type sink 116 is formed in the epitaxial layer 115 from the top surface of the epitaxial layer 115 to N-type buried layer 113 so that the N-type sink 116 can separate the elements of the vertical bipolar transistor in the horizontal direction by defining a P-type well 117 in the epitaxial layer 115. A base mask 119 is formed with an opening 121 to expose a portion of the P-type well 117 in the epitaxial layer 115 for defining a base pattern of the vertical bipolar junction transistor.

The epitaxial layer 115 has a P-type collector enhancement region 123 formed by implanting impurities above the N-type buried layer 113 through the opening 121 and an N-type base region 125 is formed by implanting impurities above the P-type collector enhancement region 123 through the opening 121. Then, a polysilicon emitter contact region 127 is formed on the surface of the N-type base region 125. A P-type emitter region 129 is formed below the emitter contact region 127 and in an upper portion of the surface of the N-type base region 125. Furthermore, an N-type base contact region 131 is formed in an upper portion of the surface of the N-type base region 125. A plurality of collector contact regions 133 and 134 are formed in upper portions of the surface of the P-type well 117 except the portion where the base region 125 is formed.

However, the epitaxial layer of the vertical bipolar junction transistor used for the collector region according to the prior art is normally a thin epitaxial layer 115. In the prior art method for fabricating a vertical bipolar junction transistor, it is necessary to perform many doping processes and thermal processes through the opening 121 in order to cause the multi-lever structures including the collector enhancement region 123, the base region 125, the emitter region 129, the base contact region 131, and so on formed respectively in the epitaxial layer 115. Thus, precisely controlling the position of the multi-lever structures such as the collector enhancement region 123, the base region 125, the emitter region 129, the base contact region 131, and so on in the epitaxial layer 115 having limited width and depth is difficult. Furthermore, precisely controlling the concentration of implanted impurities in the above-mentioned multi-lever structures is also difficult after many thermal processes so that the electrical performance of the vertical bipolar junction transistor is greatly affected.

SUMMARY OF INVENTION

It is therefore a primary object of the claimed invention to provide a method for fabricating a vertical bipolar junction transistor to simplify the process effectively and ensure high-precision control over the position of each element in the transistor.

According to the claimed invention, a first doping region of a first conductivity type, a second doping region of a second conductivity type, and a plurality of isolated structures positioned on surfaces of the first doping region and the second doping region are formed on a substrate of a semiconductor wafer. A third doping region of the first conductivity type is formed in an upper portion of the second doping region. Next, a shielding layer is formed. A portion of the shielding layer is then removed to form an opening within the shielding layer to expose a portion of the third doping region. Subsequently, a doping layer of the second conductivity type is formed on a surface of the third doping region. A self-aligned silicidation process is performed to form a silicide layer on the surfaces of the second doping region, the third doping region, and the doping layer. The silicide layer functions as at least one contact region of a vertical bipolar junction transistor.

The present invention defines the position of the third doping region (the base) of the vertical bipolar junction transistor by the isolated structures, the position of the emitter of the vertical bipolar junction transistor by forming the doping layer on the surface of the substrate, and the position of the contact region of vertical bipolar junction transistor by a self-aligned silicidation process.

It is an advantage of the claimed invention that the position of each element in the transistor and the concentration of implanted impurities can be precisely controlled, effectively simplifying the manufacturing process, and improving the electrical performance of the element.

These and other objectives of the present invention will no doubt become obvious to those of ordinary skill in the art after reading the following detailed description of the preferred embodiment, which is illustrated in the multiple figures and drawings.

DETAILED DESCRIPTION

Figure 1:
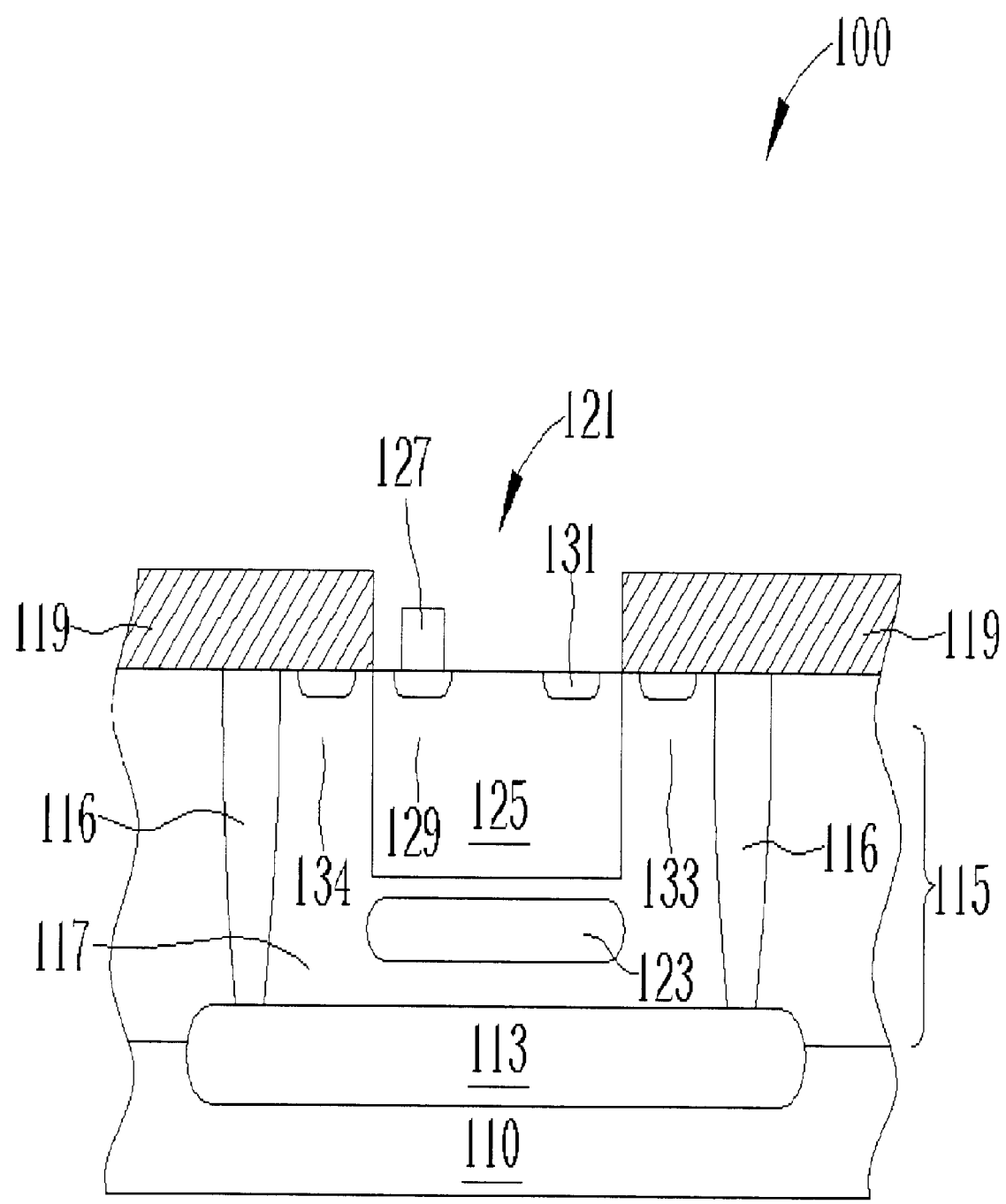
FIG. 1 shows the method for fabricating a vertical bipolar junction transistor according to the prior art.
Figure 2:
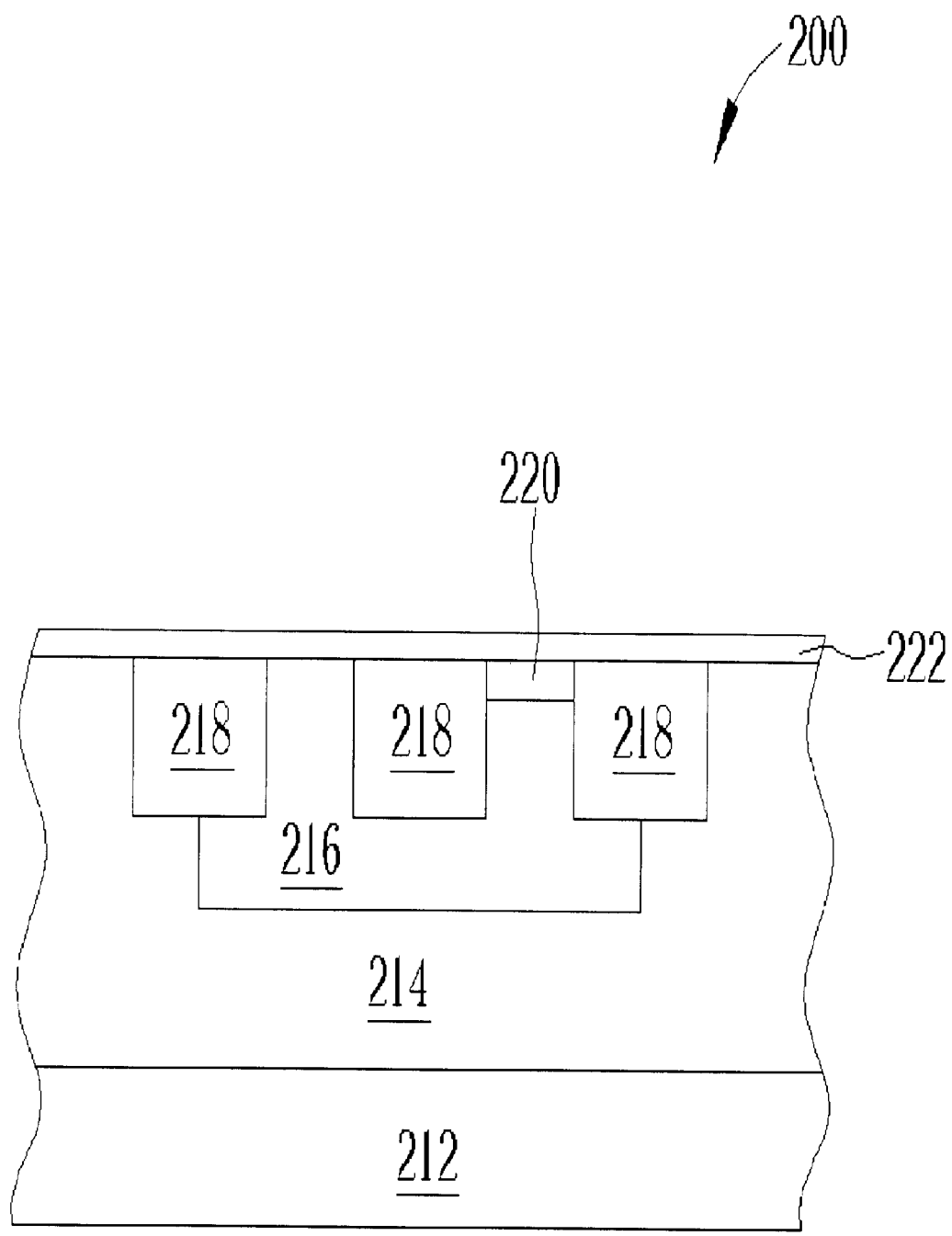
FIG. 2 to FIG. 5 show method schematics according to the first embodiment of the present invention.

FIG. 2 to FIG. 5 show method schematics according to a first embodiment of the present invention. With reference to FIG. 2 to FIG. 5, a semiconductor wafer 200 having a substrate 212 is provided. A first doping region 214 of a first conductivity type, a second doping region 216 of a second conductivity type, and a plurality of isolated structures 218 positioned on surfaces of the first doping region 214 and the second doping region 216 are formed on the substrate 212.

The first conductivity type could be a P-type and the second conductivity type could be an N-type. However, the present invention is not limited in this way. The first conductivity type also could be an N-type and second conductivity type also could be a P-type. The second doping region 216 is used for defining the position of the collector of the bipolar junction transistor. The second doping region 216 is surrounded by the first doping region 214 to isolate the second doping region 216 and to avoid ions diffusing horizontally into other electrical elements. Isolated structures 218 could be formed by shallow trench isolation (STI) or by local oxidation of silicon (LOCOS). The isolated structures 218 defines at least one predetermined region on the surface of the second doping region 216 for a base of the bipolar junction transistor.

Next, an ion implantation process is performed to form a third doping region 220 of the first conductivity type in an upper portion of the second doping region 216 to form the base of the bipolar junction transistor. According to the electrical requests of the manufacture or the doping concentration requests of the manufacture for the implanted impurities, the ion implantation process for forming the third doping region 220 could choose to implant the impurities with a source/drain of the CMOS process. For example, when the transistor needs to tolerate a higher voltage, the ion implantation process for forming the third doping region 220 could simultaneously implant the impurities with a process for forming a lightly doped drain (LDD) and a source/drain of the CMOS on the semiconductor wafer 200. The ion implantation process for forming the third doping region 220 also could simultaneously implant the impurities with a process for just forming a lightly doped drain (LDD) of the CMOS on the semiconductor wafer 200. Thus, the vertical bipolar junction transistor of the present invention would have a narrower base width and a better unity-gain frequency (Ft). The present invention also could perform a mask process to form the third doping region 220, and use a specific concentration of the implanted impurities to perform an ion implantation process. Therefore, the bipolar junction transistor could provide a different breakdown voltage to optimize the electrical performance.

A shielding layer 222 could be then formed on the surface of the semiconductor wafer 200. The shield layer 222 could consist substantially of oxide and/or silicon nitride, and/or other dielectric materials in order to protect the CMOS transistor or other elements on the semiconductor wafer 200.

Figure 3:
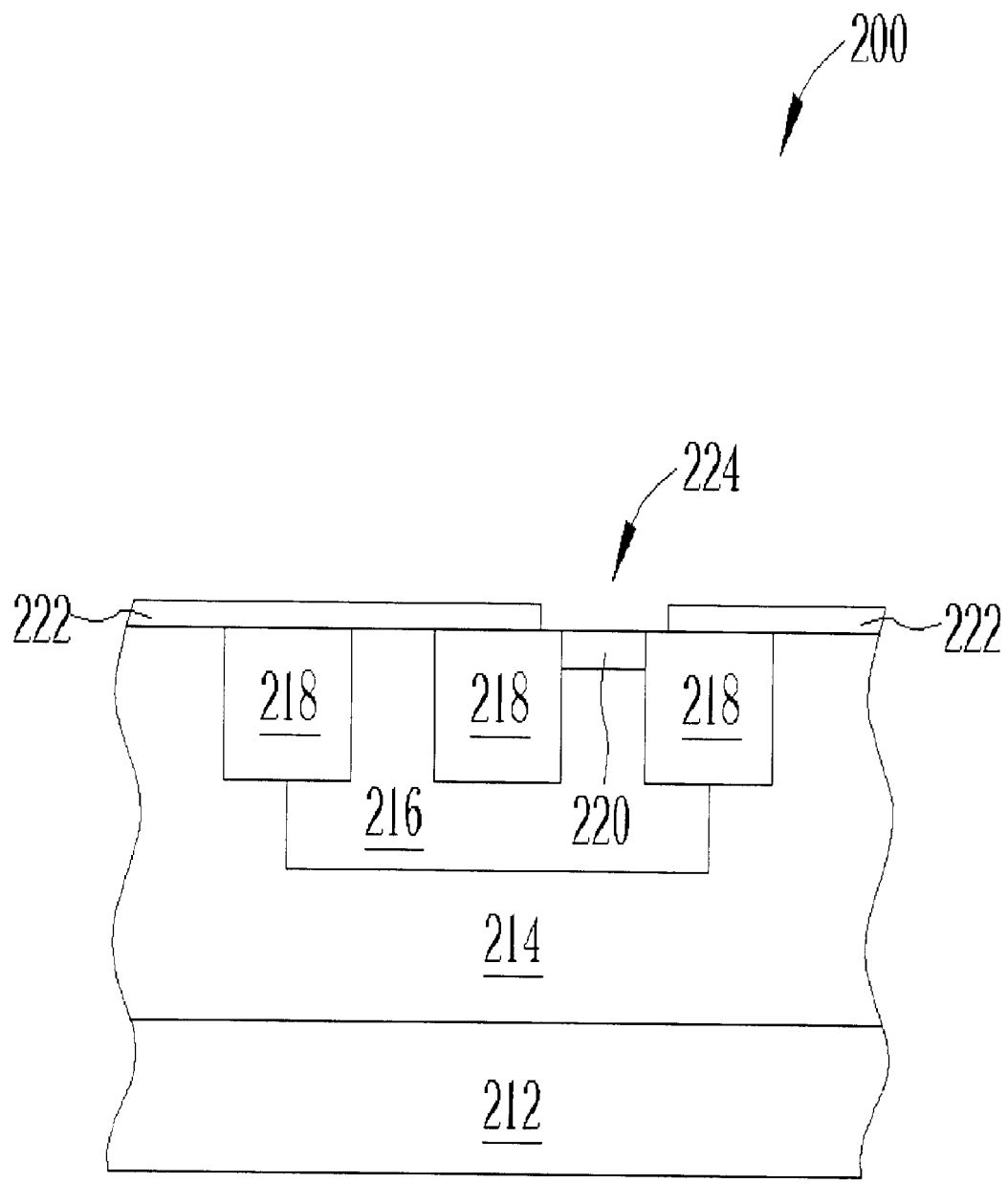
Figure 4:
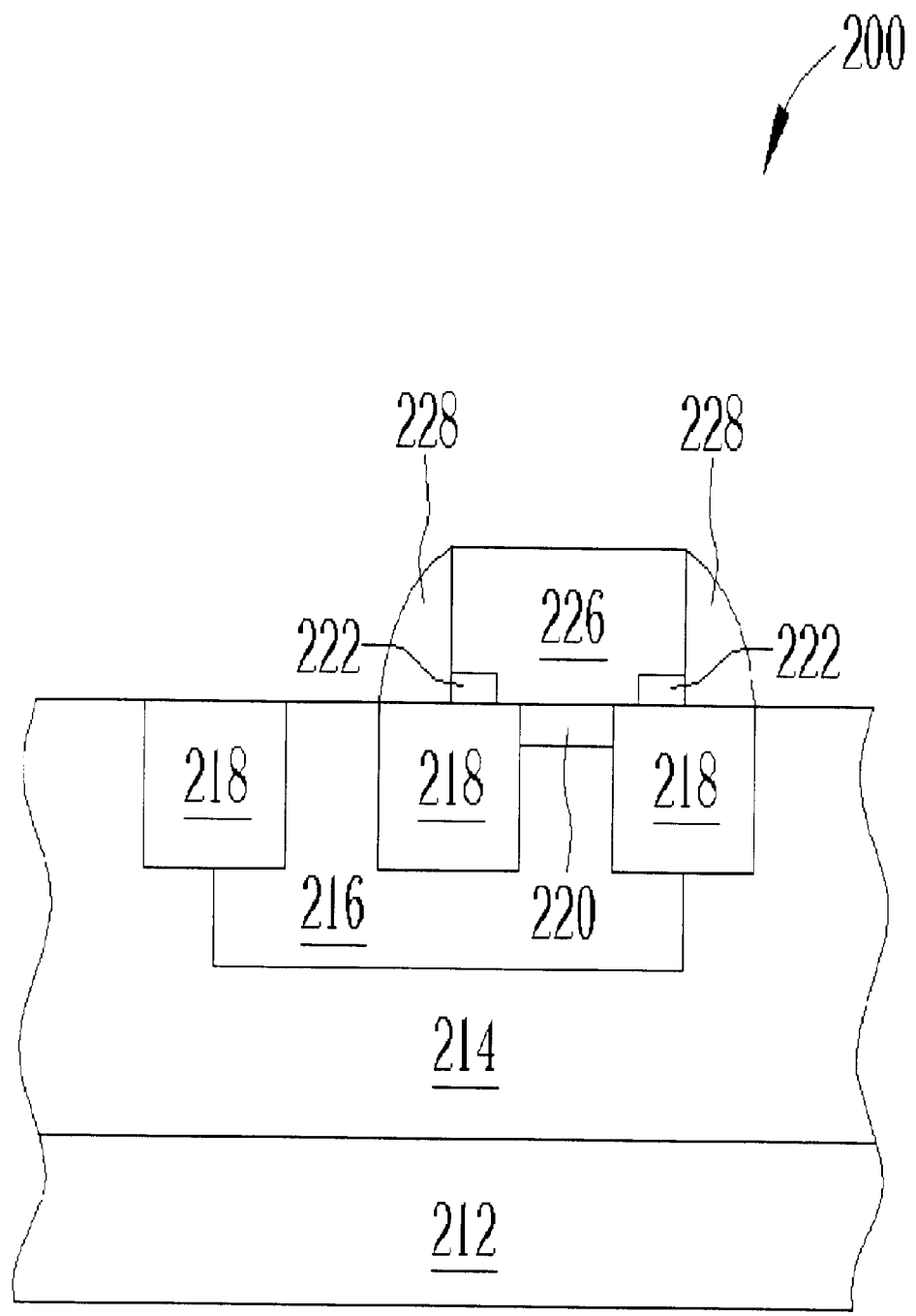

Next, as shown in FIG. 3, an opening 224 can be formed within the shielding layer 222 to expose a portion of the third doping region 220. As shown in FIG. 4, a doping layer 226 of the second conductivity type can be formed on a surface of the third doping region 220. The portion of the shielding layer 222 is removed. The doping layer 226 is used for the emitter of the bipolar junction transistor. The doping layer 226 would be made from epitaxy, amorphous silicon, or polysilicon. In this embodiment of the present invention it is suggested that the doping layer 226 can further include a heavy doping of the second conductivity type to reduce the resistance of the doping layer.

When the transistor of the first embodiment of the present invention is a PNP transistor, the process for forming the emitter 226 could be combined with a process for forming a base of another NPN transistor on the semiconductor wafer 200. This means that performing a same P-type implantation process reduces the resistance of both. A photolithography process and an etching process are then performed to simultaneously define the patterns of the emitter 226 of the PNP transistor and the base of the other NPN transistor.

Obviously, when the transistor of this embodiment of the present invention is an NPN transistor, the process for forming the emitter 226 could be combined with a process for forming a base of another PNP transistor on the semiconductor wafer 200. This means that performing a same N-type implantation process reduces the resistance of both. A photolithography process and an etching process are then performed to simultaneously define the patterns of the emitter 226 of the NPN transistor and the base of the other PNP transistor.

Also as shown in FIG. 4, a spacer 228 can be formed on the surface of the side of the doping layer 226. The spacer 228 is mainly used to protect a portion of the surface of the doping layer 226 in order to avoid a short in the transistor made by any unnecessary contact region in the doping layer 226 formed by the following self-aligned silicidation process.

Figure 5:
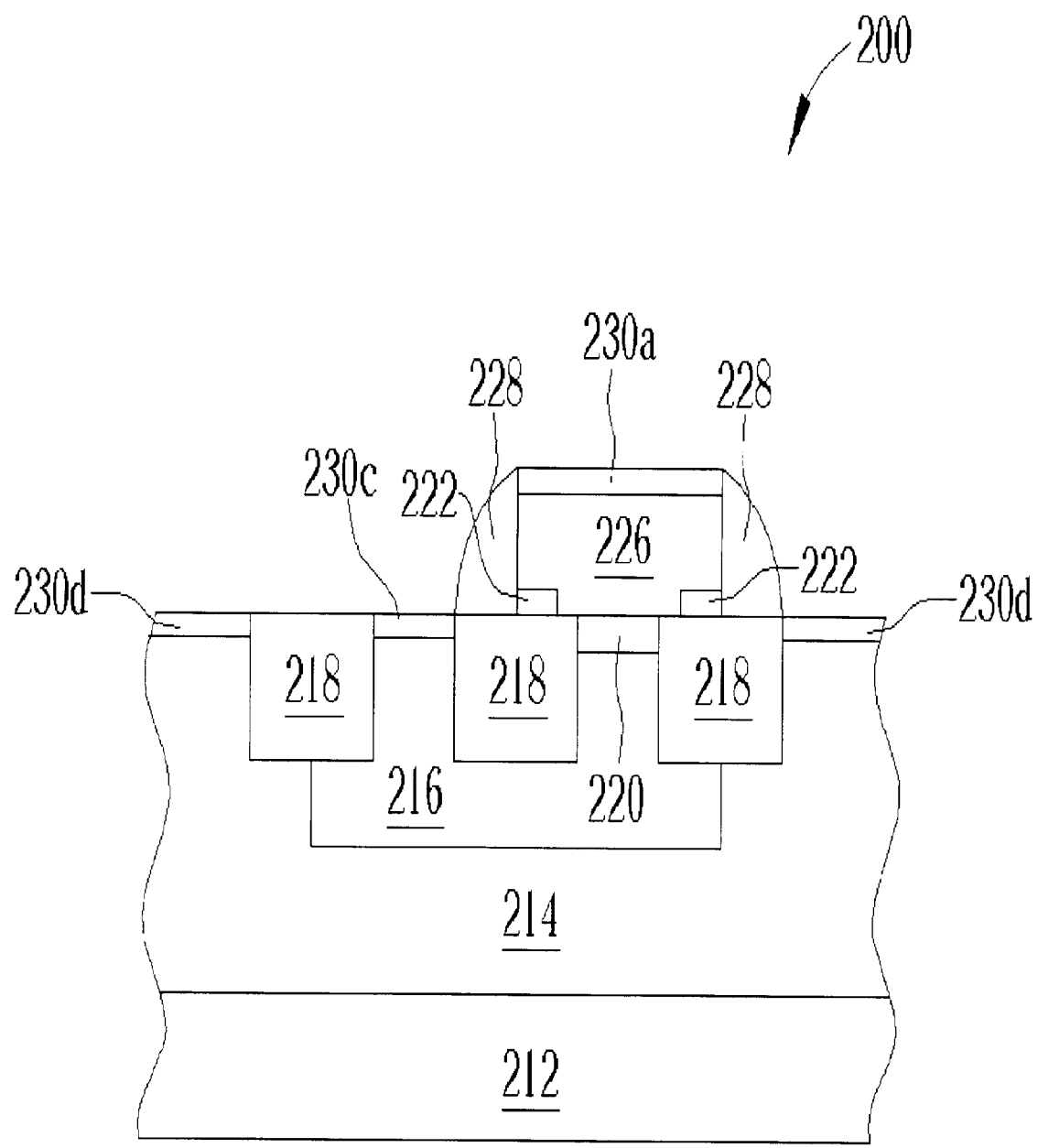
Figure 6:
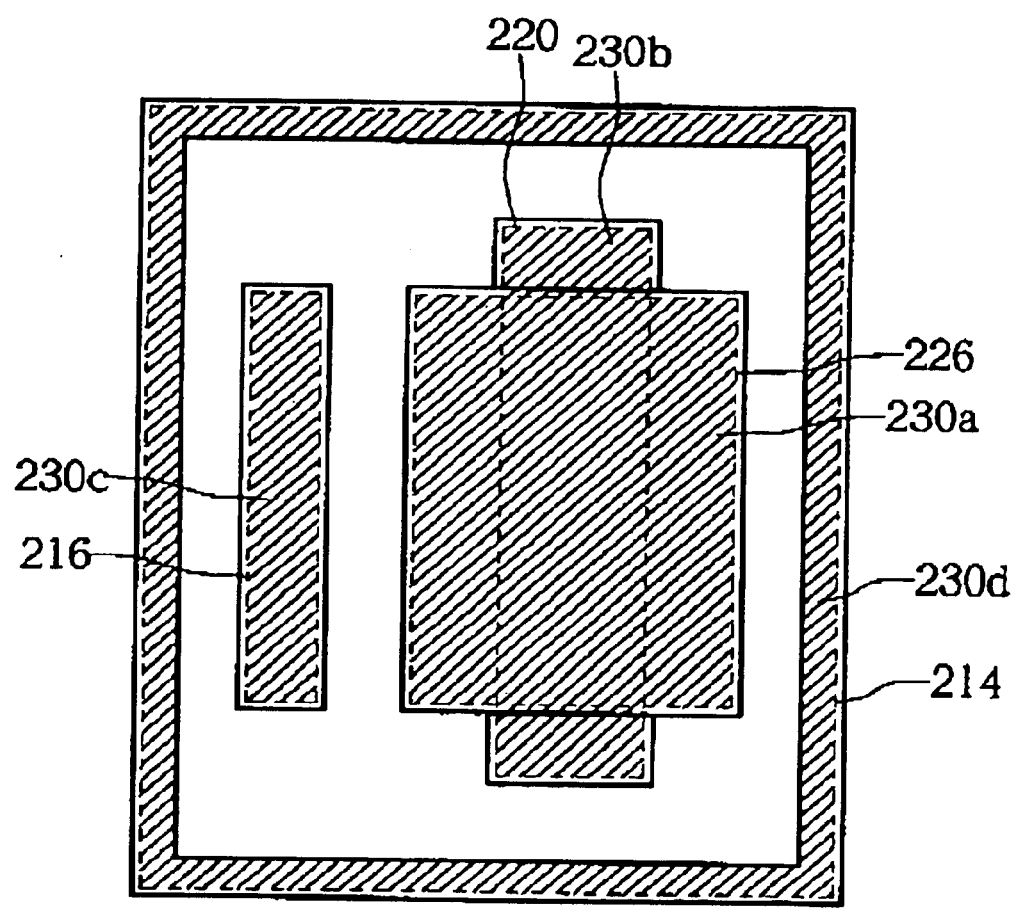
FIG. 6 shows a top view of the metal contact region according to a first embodiment of the present invention.
Figure 7:
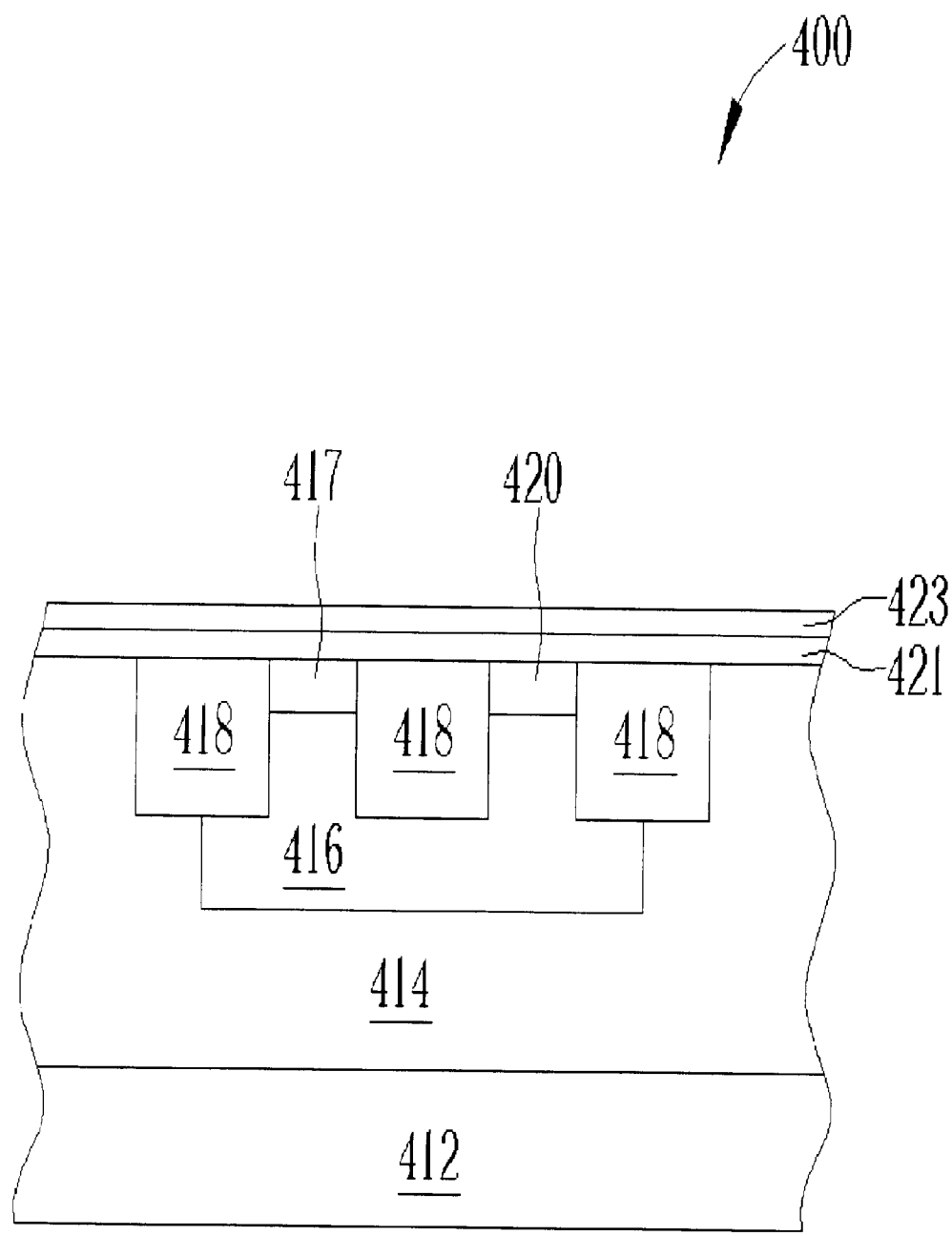
FIG. 7 to FIG. 11 show method schematics according to a second embodiment of the present invention.

As shown in FIG. 5, a self-aligned silicidation process can be utilized to form a silicide layer 230a on the surface of the doping layer 226, a silicide layer 230b (230b is shown in FIG. 6) on the portion of the third doping region 220 not covered by the doping layer 226, a silicide layer 230c on the surface of the second doping region 216, and a silicide layer 230d on the surface of the first doping region 214. The silicide layers 230a, 230b, 230c, and 230d function as contact regions of the vertical bipolar junction transistor. FIG. 6 shows a top view of the metal contact region according to the first embodiment of the present invention. As shown in FIG. 6, the self-aligned silicidation process forms the silicide layer 230a on the doping layer 226 to be an emitter contact region, the silicide layer 230b on the portion of the third doping region 220 not covered by the doping layer 226 to be a base contact region, the silicide layer 230c on second doping region 216 to be a collector contact region, and the silicide layer 230d to be a contact region for other electrical demands. For example, the silicide layer 230d functions as the contact region on the surface of the first doping region 214 of the vertical bipolar junction transistor.

FIG. 7 to FIG. 11 show the method schematics according to a second embodiment of the present invention. With reference to FIG. 7 to FIG. 11, a semiconductor wafer 400 having a substrate 412 is provided. Then, a first doping region 414 of a first conductivity type, a second doping region 416 of a second conductivity type, and a plurality of isolated structures 418 positioned on surfaces of the first doping region 414 and the second doping region 416 are formed. The first conductivity type could be P-type and the second conductivity type could be N-type. However, the present invention is not limited in this way. The first conductivity type also could be N-type and the second conductivity type also could be P-type. The second doping region 416 is used for defining the position of the collector of the bipolar junction transistor. The second doping region 416 is surrounded by the first doping region 414 to isolate the second doping region 416 and avoid ions diffusing horizontally into other electrical elements. At least one heavy doping region 417 used for the collector enhancement region is formed on the surface of the second doping region 416. The isolated structures 418 could be formed by shallow trench isolation (STI) or by local oxidation of silicon (LOCOS). The isolated structures 418 define at least one a predetermined region on the surface of the second doping region 416 for a base of the bipolar junction transistor.

Next, an ion implantation process is performed to form a third doping region 420 of the first conductivity type in an upper portion of the second doping region 416 for forming a base of the bipolar junction transistor. According to the electrical requests of the manufacture or the doping concentration requests of the impurities implanted during manufacture, the ion implantation process for forming the third doping region 420 could choose to simultaneously implant the impurities with a source/drain of the CMOS process. For example, when the transistor needs to tolerate a higher voltage, the ion implantation process for forming the third doping region 420 could simultaneously implant the impurities with a process for forming a lightly doped drain (LDD) and a source/drain of the CMOS on the semiconductor wafer 400. The ion implantation process for forming the third doping region 420 also could simultaneously implant the impurities with a process for just forming a lightly doped drain (LDD) of the CMOS on the semiconductor wafer 400. Thus, the bipolar junction transistor of the present invention would have a narrower base width and a better unity-gain frequency (Ft). In addition, the present invention also could perform a mask process to form the third doping region 420 and use a specific concentration of the impurities implanted to perform the ion implantation process. Therefore, the bipolar junction transistor could provide different breakdown voltages to optimize the electrical performance.

Then, a first shielding layer 421 and a second shielding layer 423 are formed on the surface of the semiconductor wafer 400 to protect the CMOS transistor or other elements on the semiconductor wafer 400. The first shield layer 421 comprises oxide, and the second shield layer 423 comprises silicon nitride.

Figure 8:
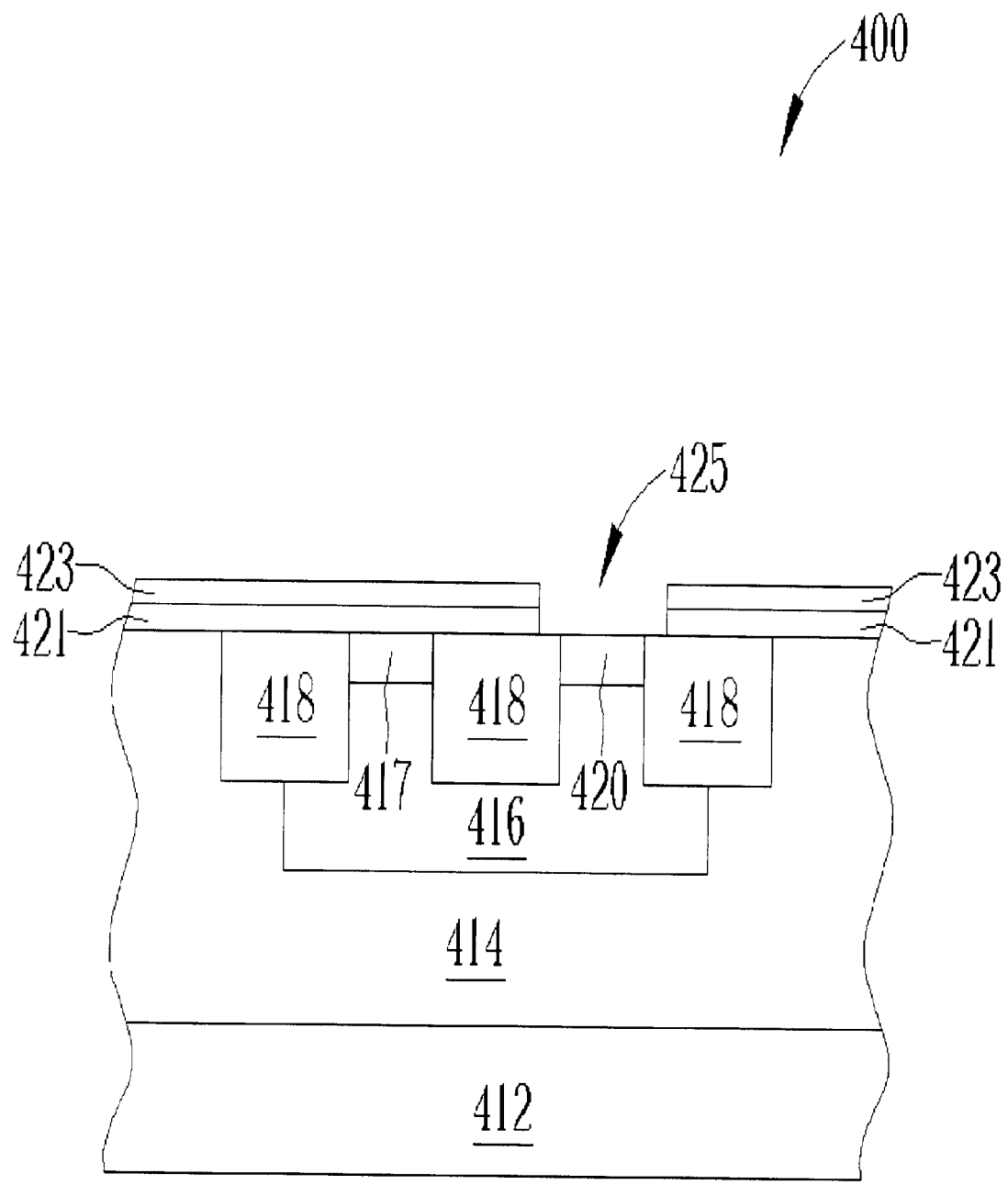
Figure 9:
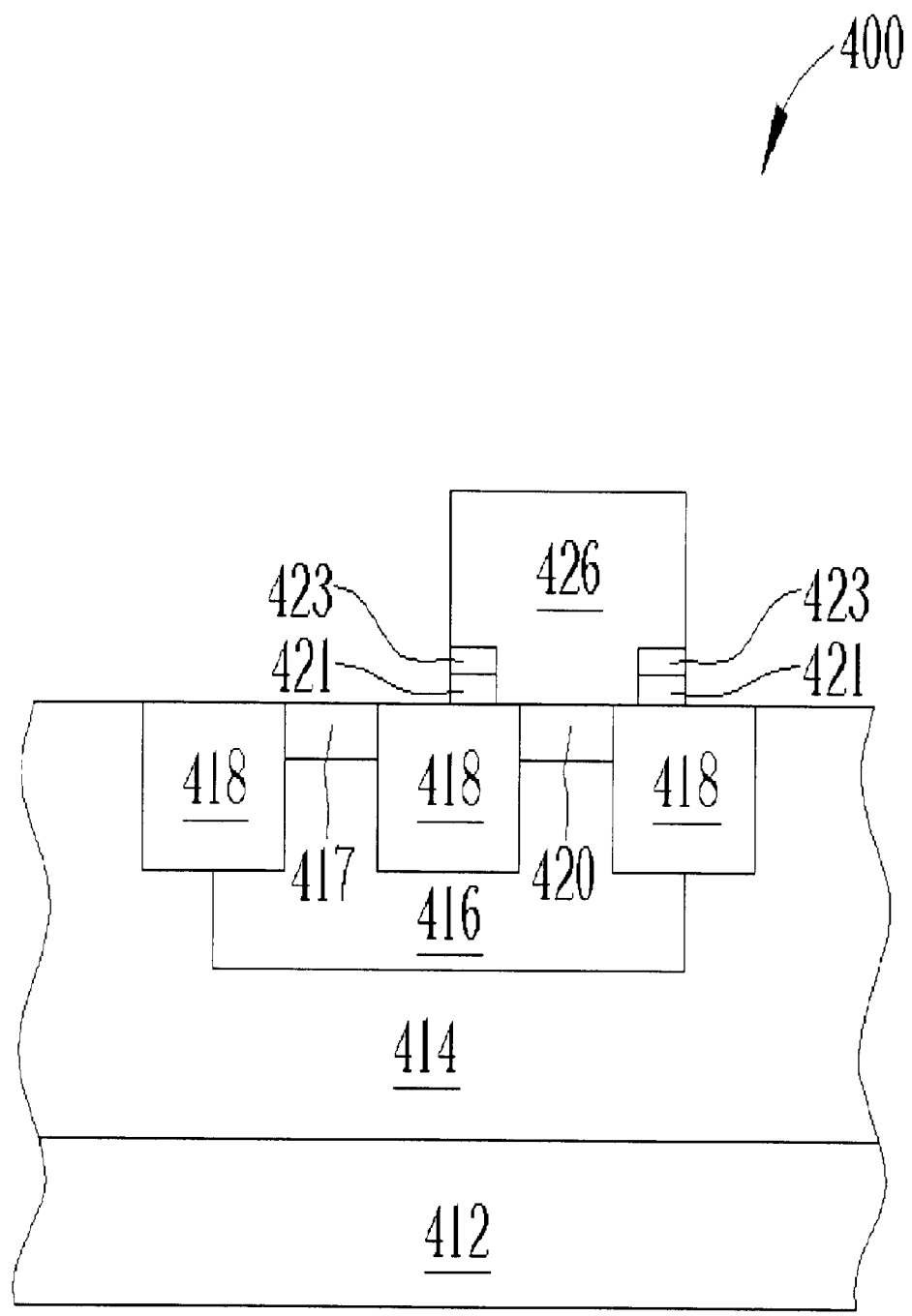

Next, as shown in FIG. 8, an opening 425 is formed within the first shielding layer 421 and the second shielding layer 423 to expose a portion of the third doping region 420. As shown in FIG. 9, a doping layer 426 of the second conductivity type is formed on a surface of the third doping region 420, after a portion of the first shielding layer 421 and the second shielding layer 423 are removed. The doping layer 426 is used for the emitter of the bipolar junction transistor. The doping layer 426 could be made from epitaxy/amorphous silicon/polysilicon.

Figure 10:
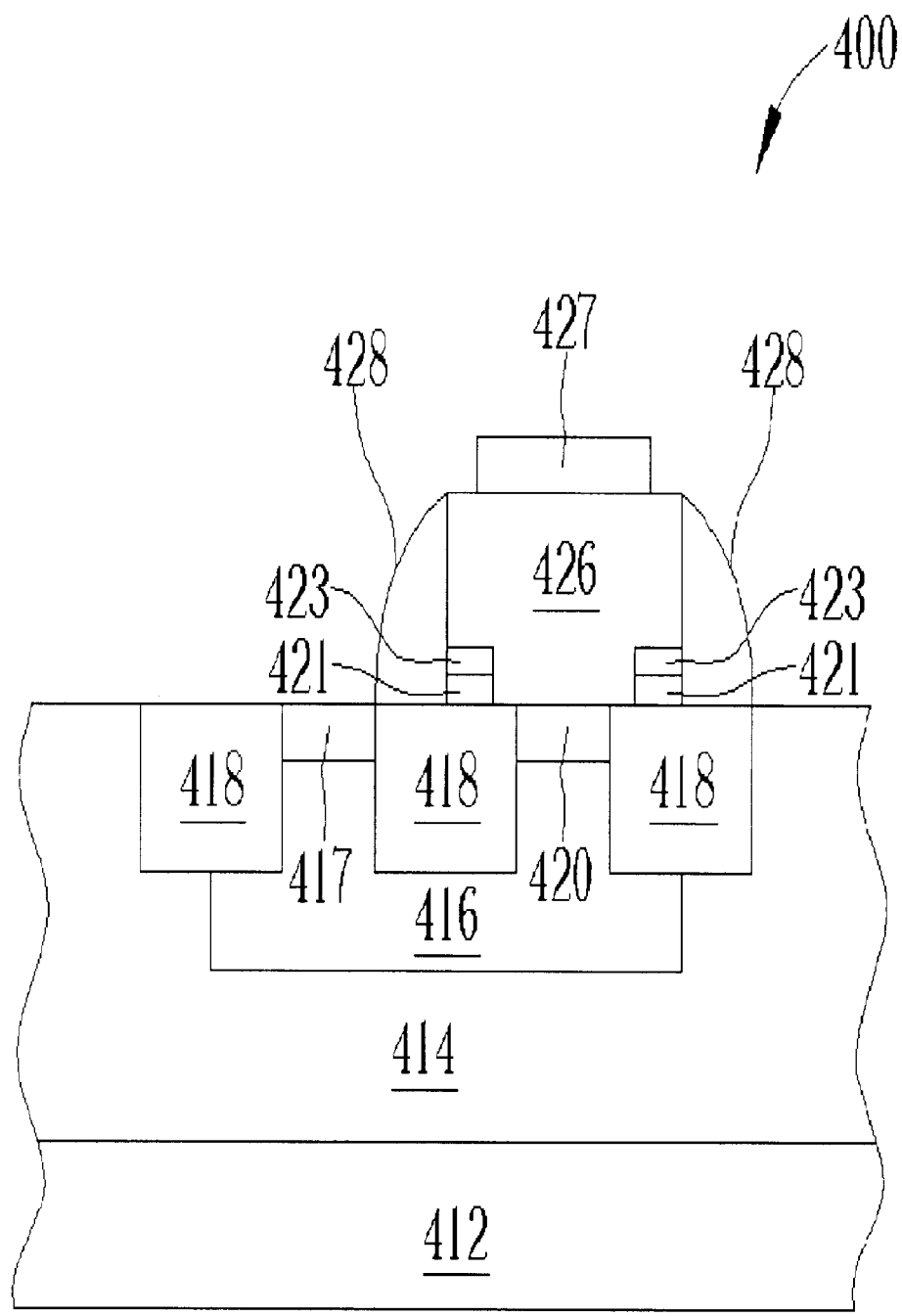

Next, as shown in FIG. 10, an SAB layer 427 is formed on the surface of the portion of the doping layer 426 and at least one spacer 428 is formed on the surface of the side of the doping layer 426. The SAB layer 427 is mainly used to protect a portion of the surface of the doping layer 426 in order to avoid a following silicide layer 430 on the surface of the doping layer 426 penetrating excessively deep into the doping layer 426 and destroying the junction between the doping layer 426 and the third doping region 420, that is to say the junction between the base and the collector. The process for forming the SAB layer 427 is to deposit a thick dielectric layer firstly. Then an etch back process is performed to remove a portion of the dielectric layer except at the surface of the doping layer 426 in order to form the SAB layer 427 on the doping layer 426 and the spacer 428 on the surface of the side of the doping layer 426.

Additionally, when the transistor of the second embodiment of the present invention is a PNP transistor, the process for performing the emitter 426 could be combined with a process for forming a base of another NPN transistor on the semiconductor wafer 400, meaning that performing a same P-type implantation process reduces the resistance of both. Then, a photolithography process and an etching process are performed to simultaneously define the patterns of the emitter of the PNP transistor 426 and the base of the other NPN transistor. When the transistor of the second embodiment of the present invention is an NPN transistor, the process for forming the emitter 426 could be combined with a process for performing a base of another PNP transistor on the semiconductor wafer 400, meaning that performing a same N-type implantation process reduces the resistance of both. Then, a photolithography process and an etching process are performed to simultaneously define the patterns of the emitter 426 of the NPN transistor and the base of the other PNP transistor.

Figure 11:
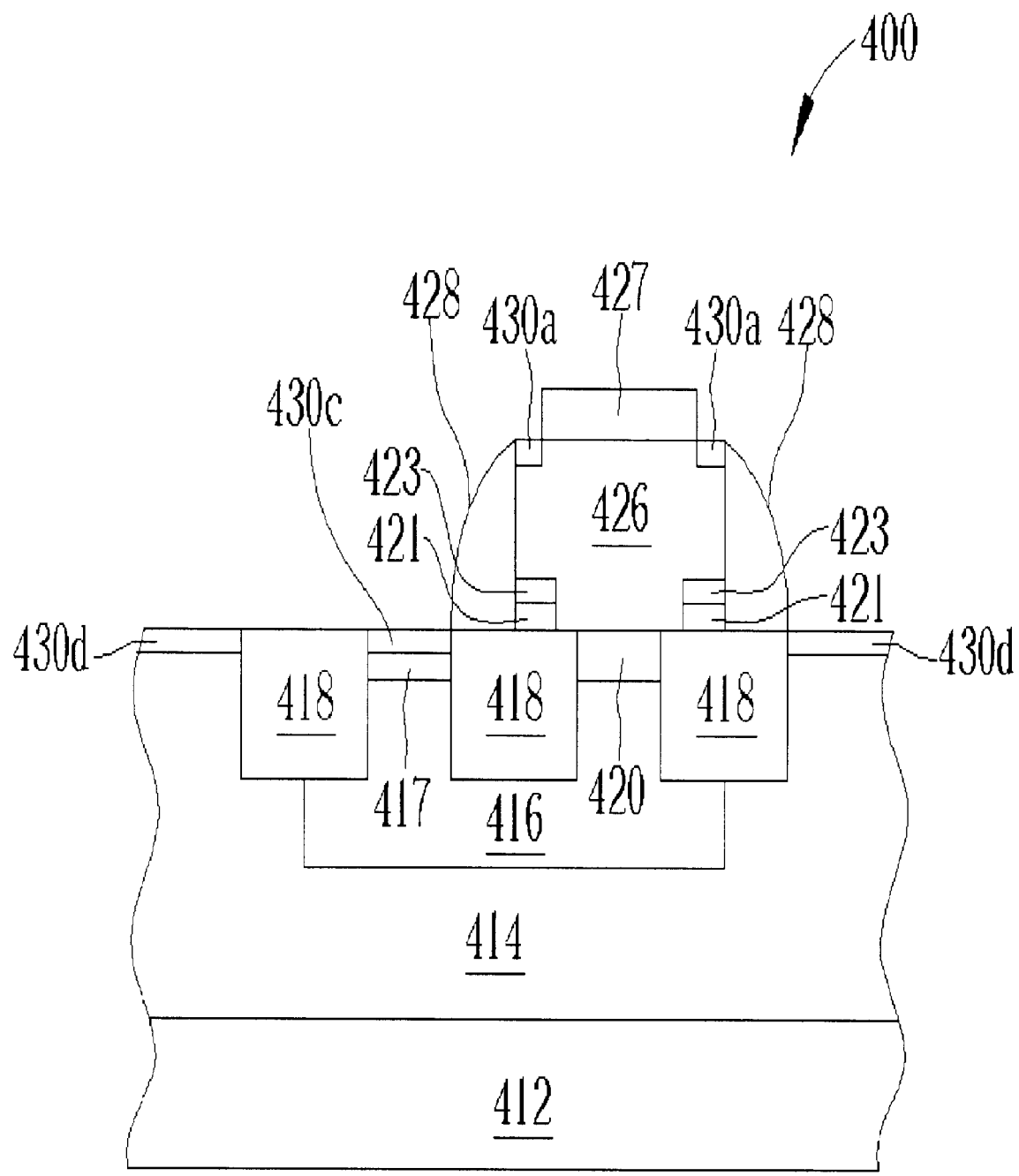

Next, as shown FIG. 11, a self-aligned silicidation process is utilized to form a silicide layer including 430a on the surfaces of the doping layer 426, 430b (not shown in FIG. 11), 430c on the surfaces of the heavy doping region 417, and 430d on the surfaces of the first doping region 414. The silicide layer functions as contact regions for the vertical bipolar junction transistor.

For making the present invention clearer and easier to understand, FIG. 12 to FIG. 16 are shown to explain a third embodiment of the present invention for fabricating a vertical PNP transistor. The sphere of action of the collector contact region of the transistor is obviously different from previous embodiments of the transistor.

Figure 12:
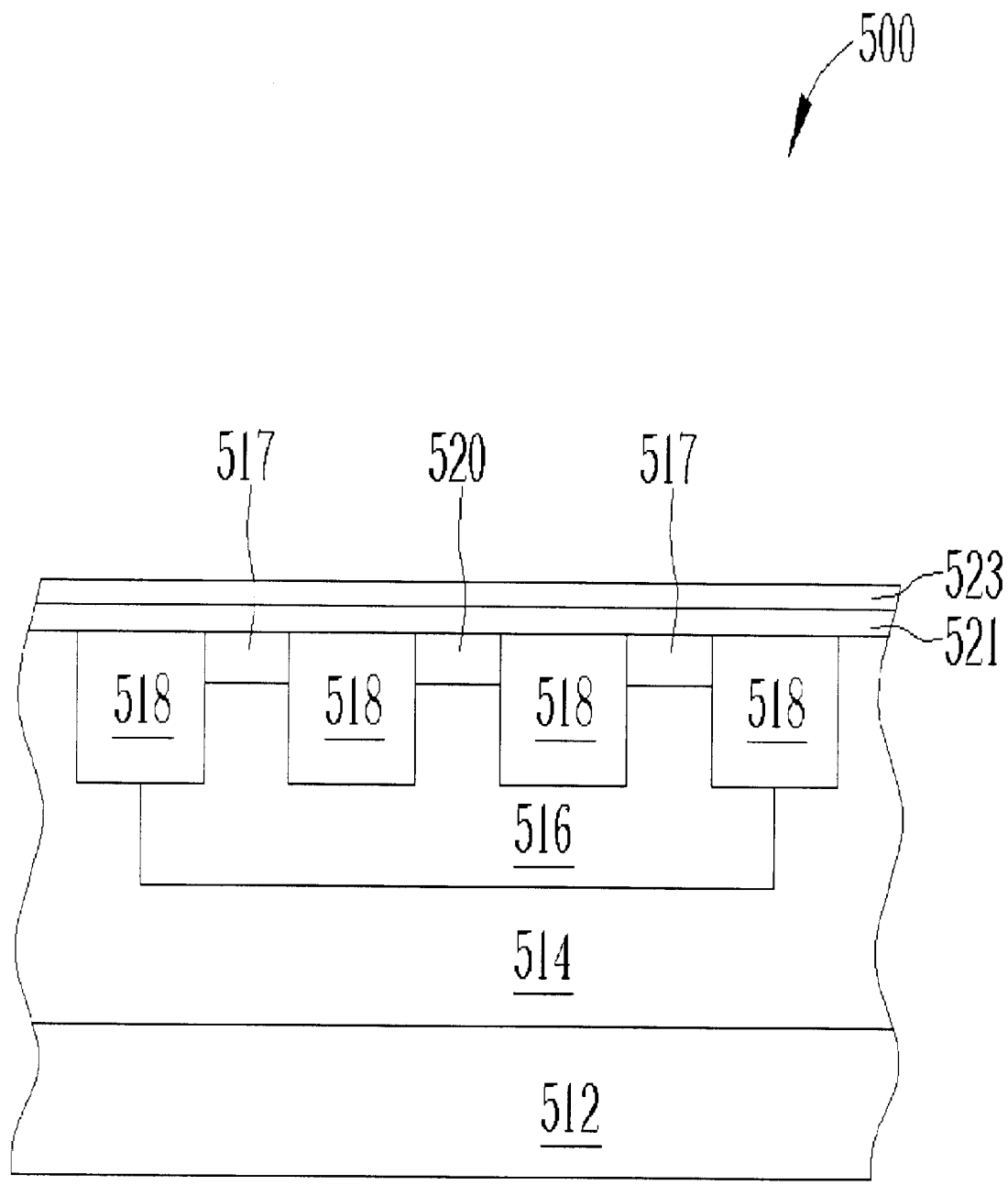
FIG. 12 to FIG. 16 show method schematics according to a third embodiment of the present invention.

As shown in FIG. 12, a semiconductor wafer 500 having a substrate 512 is provided. Then, a first doping region of N-type 514 and a second doping region of P-type 516 are formed on the substrate 512. The second doping region of P-type 516 could include two heavy doping regions of P-type 517. A plurality of isolated structures 518 are formed on surfaces of the first doping region of N-type 514 and the second doping region of P-type 516. The second doping region of P-type 516 is used for defining the region of the collector region of the bipolar junction transistor. The second doping region of P-type 516 is surrounded by the first doping region of N-type 514 to isolate the second doping region of P-type 516 and avoid ions diffusing horizontally into other electrical elements. Isolated structures 518 could be formed by shallow trench isolation (STI) or by local oxidation of silicon (LOCOS). The isolated structures 518 define at least one predetermined region on the surface of the second doping region of P-type 516 to form a base of the PNP transistor.

Next, an ion implantation process is utilized to form a third doping region of N-type 520 in an upper portion of the second doping region of P-type 516 for forming a base of the bipolar junction transistor. According to the electrical requests of the manufacture or the doping concentration requests of the manufacture for the implanted impurities, the ion implantation process for forming the third doping region of N-type 520 could choose to simultaneously implant the impurities with a source/drain of the CMOS process. For example, when the transistor needs to tolerate a higher voltage, the ion implantation process for forming the third doping region of N-type 520 could simultaneously implant the impurities with a process for forming a lightly doped drain (LDD) and a source/drain of the CMOS on the semiconductor wafer 500. Additionally, the ion implantation process for forming the third doping region of N-type 520 also could simultaneously implant the impurities with a process for just forming a lightly doped drain (LDD) of the CMOS on the semiconductor wafer 500. Thus, the PNP transistor of the third embodiment of the present invention would have a narrower base width and a better unity-gain frequency (Ft). In addition, the present invention also could perform a mask process to form the third doping region of N-type 520 and use a specific concentration of the implanted impurities to perform an ion implantation process. Therefore, the PNP transistor could provide different breakdown voltages to optimize the electrical performance.

Then, a first shielding layer 521 and a second shielding layer 523 are formed on the surface of the semiconductor wafer 500 to protect the CMOS transistor or other elements on the semiconductor wafer 500. The first shield layer 521 comprises oxide and the second shield layer 523 comprises silicon nitride.

Figure 13:
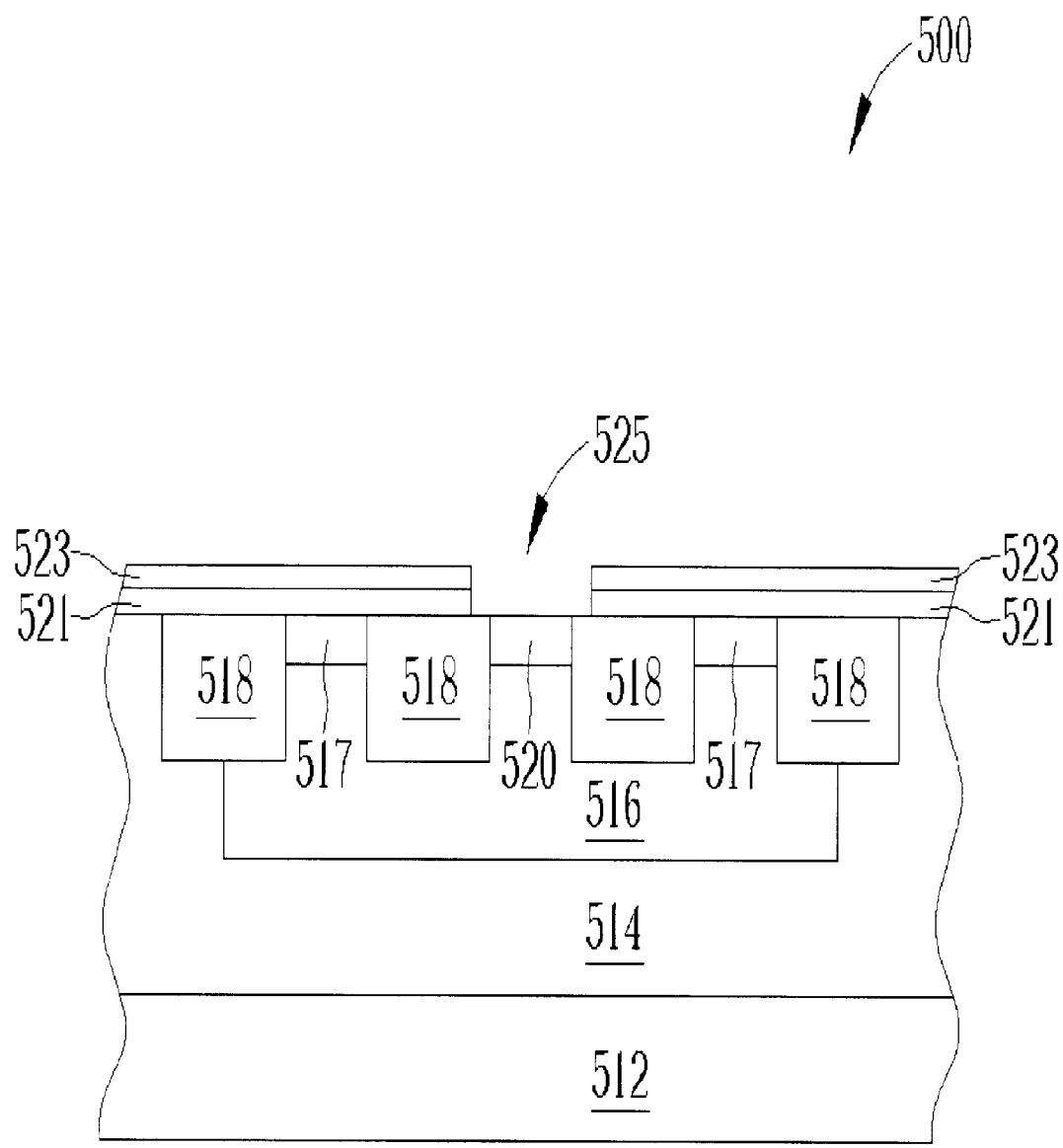
Figure 14:
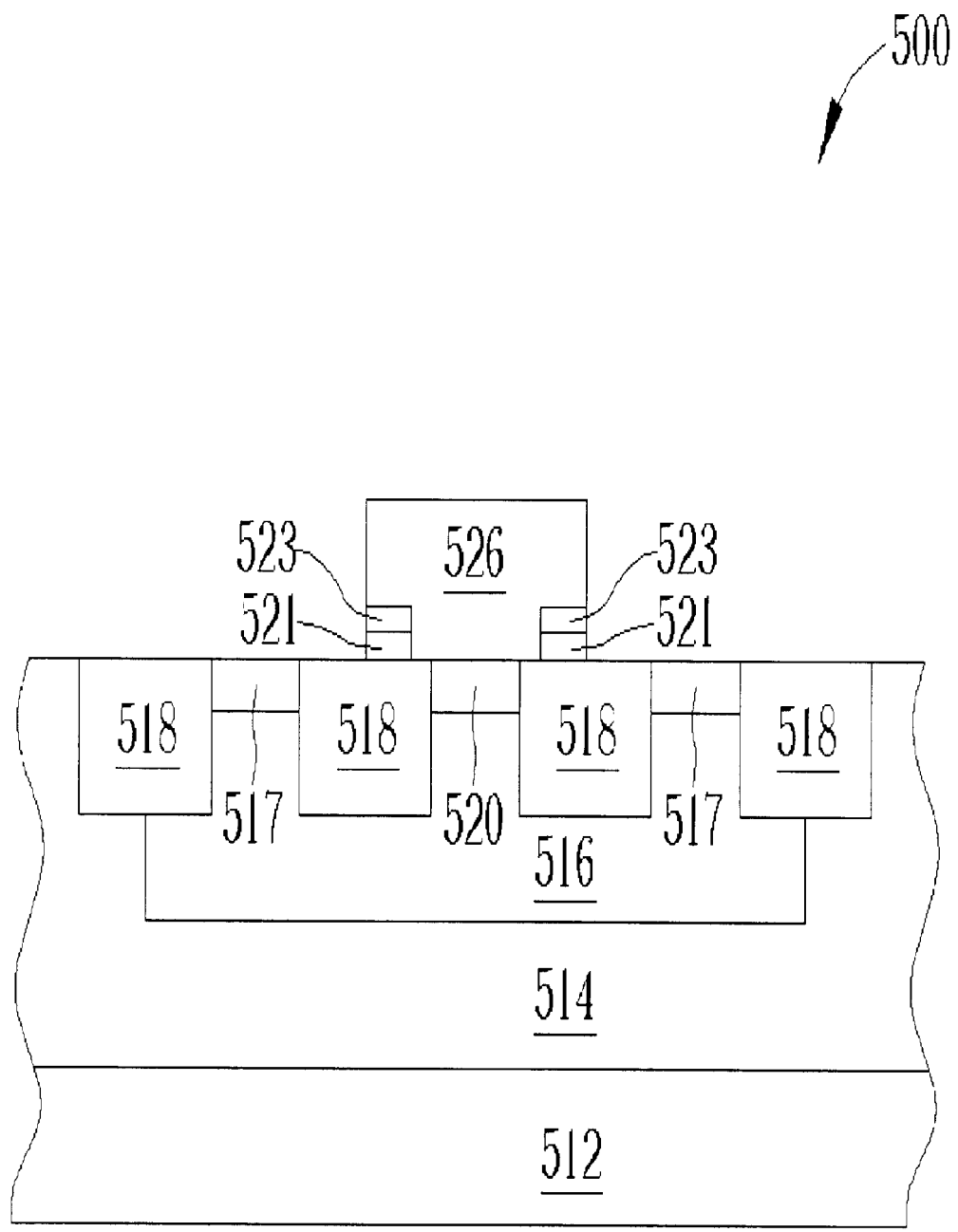

Next, as shown in FIG. 13, an opening 525 can be formed within the first shielding layer 521 and the second shielding layer 523 to expose a portion of the third doping region of N-type 520. As shown in FIG. 14, a doping layer 526 of P-type can be formed on a surface of the third doping region of N-type 520 with the removal of a portion of the first shielding layer 521 and the second shielding layer 523. The doping layer 526 is used for the emitter of the bipolar junction transistor. The doping layer 526 would be made from epitaxy/amorphous silicon/polysilicon.

Figure 15:
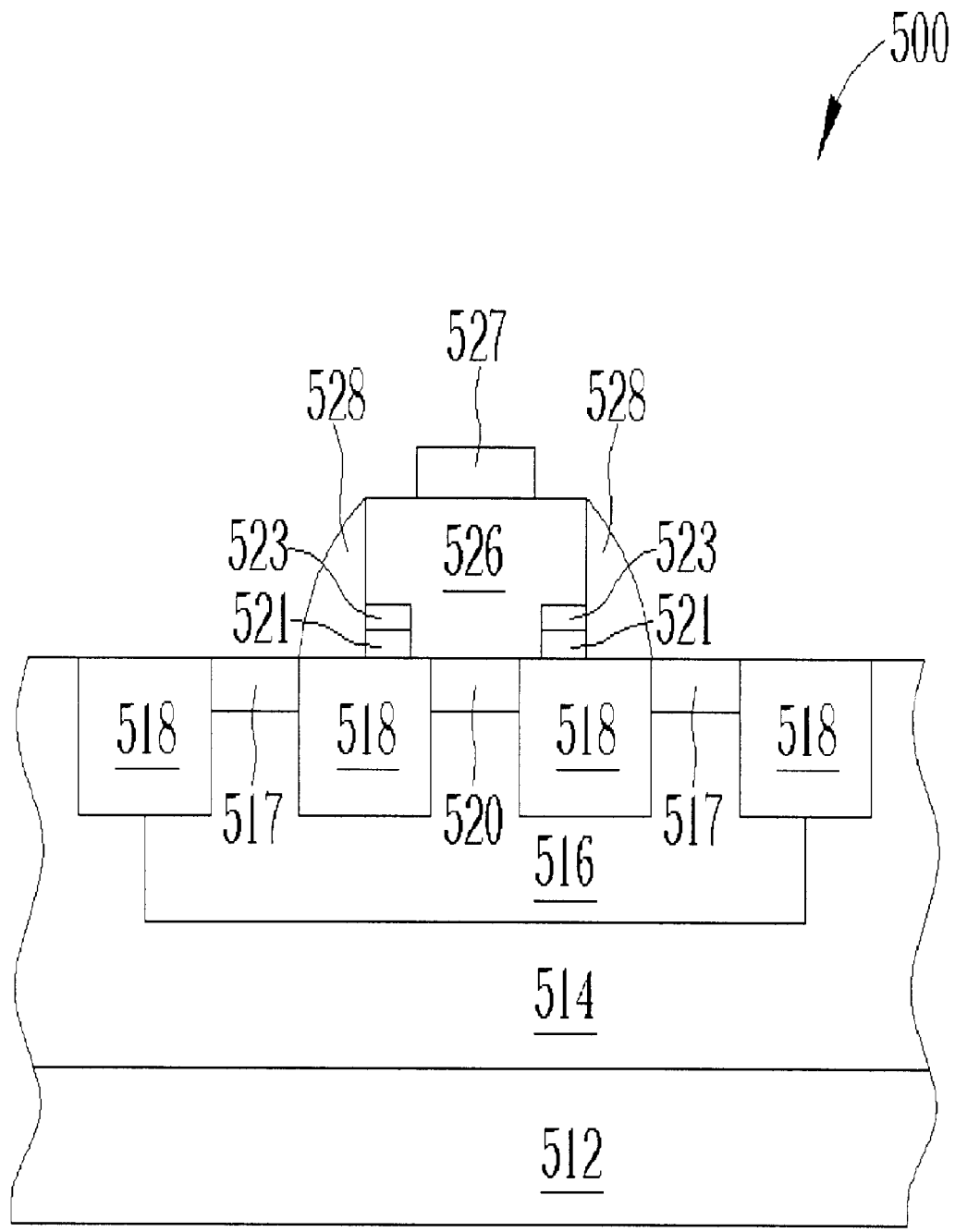

Next, as shown in FIG. 15, an SAB layer 527 can be formed on the surface of the portion of the doping layer 526 and a spacer 528 can be formed on the surface of the side of the doping layer 526.

Figure 16:
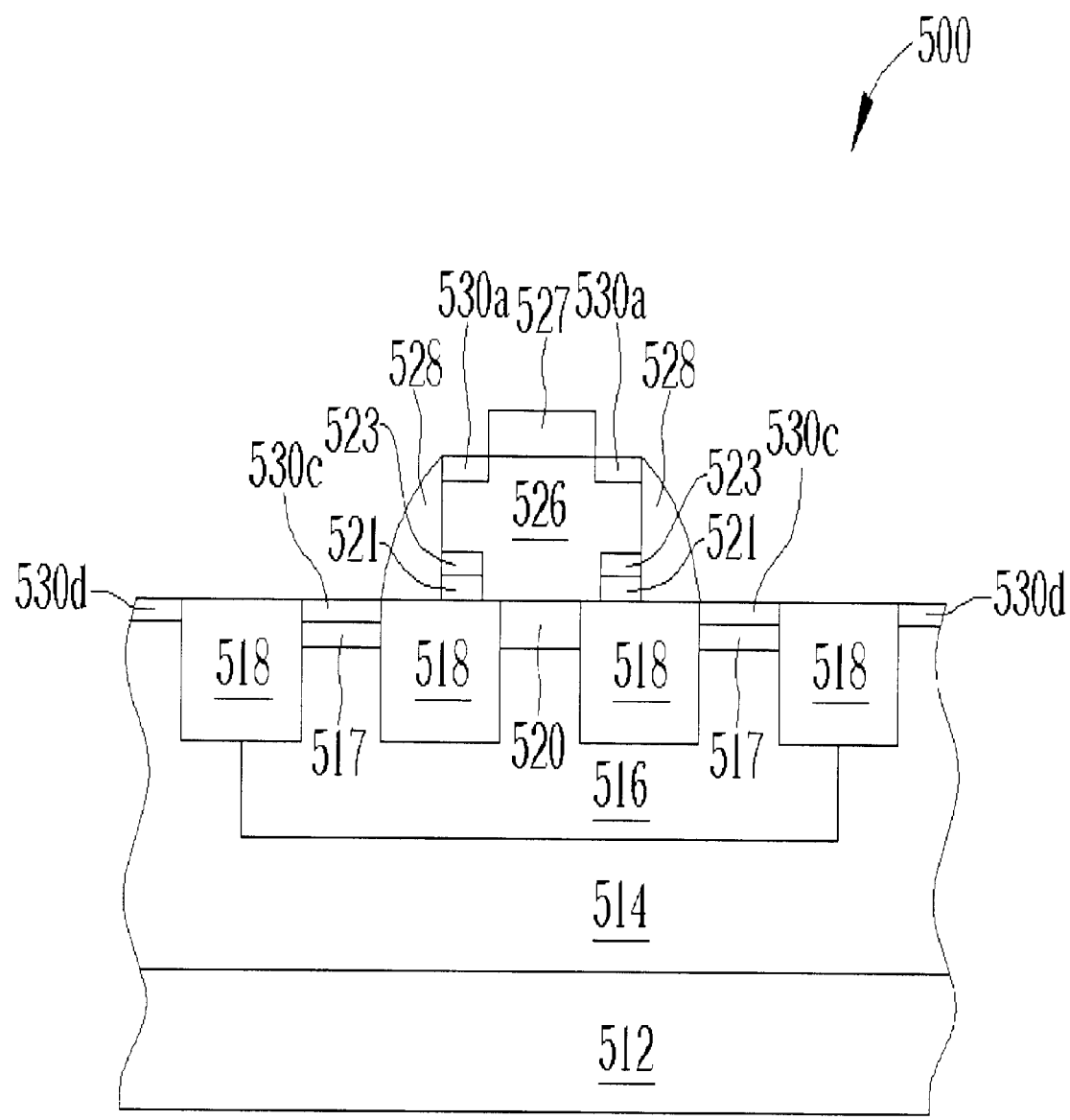
Figure 17:
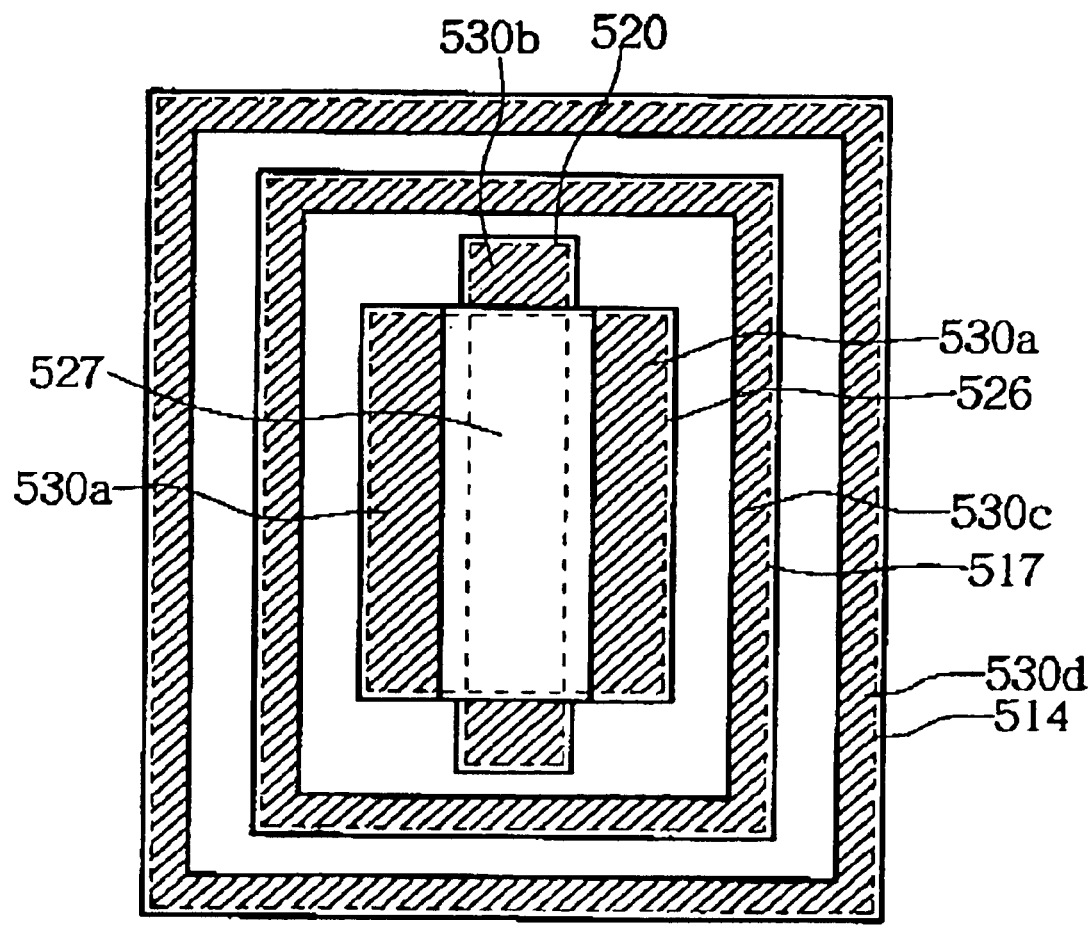
FIG. 17 shows a top view of the metal contact region according to the third embodiment of the present invention.

Next, as shown in FIG. 16, a self-aligned silicidation process is utilized to form a silicide layer including 530a on the surface of the doping layer 526, a silicide layer 530b (shown in FIG. 17) on the portion of the third doping region 520 not covered by the doping layer 526 and the SAB layer 527, a silicide layer 530c on the surface of the heavy doping region of P-type 517, and a silicide layer 530d on the surface of the first doping region 514. The silicide layers 530a, 530b, 530c, and 530d function as contact regions of the vertical PNP transistor. FIG. 17 shows a top view of the metal contact region according to the third embodiment of the present invention. As shown in FIG. 17, the self-aligned silicidation process forms the silicide layer 530a on the doping layer 526 to be an emitter contact region, the silicide layer 530b on the portion of the third doping region 520 not covered by the doping layer 526 and the SAB layer 527 to be a base contact region, the silicide layer 530c on the heavy doping region 517 to be a collector contact region 530c, and the silicide layer 530d to be a contact region for other electrical demands. For example, the silicide layer 530d functions as the contact region on the surface of the first doping region of N-type 514 of the vertical PNP transistor.

The present invention defines the position of the third doping region (the base) of the vertical bipolar junction transistor by isolated structures, defines the emitter of the vertical bipolar junction transistor by forming the doping layer on the surface of the substrate, and defines the contact region of the vertical bipolar junction transistor by a self-aligned silicidation process.

Therefore, it is an advantage of the present invention that the many prior art doping processes and thermal processes which cause the problems about position control and control of the concentration gradient of the implanted impurities are eliminated. The present invention ensures high-precision position controlling of each element in the transistor, effectively simplifying the manufacturing process, and improving the electrical performance of the elements.

Those skilled in the art will readily observe that numerous modifications and alterations of the device may be made while retaining the teachings of the present invention. Accordingly, the above disclosure should be construed as limited only by the metes and bounds of the appended claims.

What is claimed is:

1. A method for fabricating a vertical bipolar junction transistor on a semiconductor wafer including a first doping region of a first conductivity type, a second doping region of a second conductivity type, and a plurality of isolated structures positioned on surfaces of the first doping region and the second doping region, the method comprising:

forming a third doping region of the first conductivity type in an upper portion of the second doping region;

forming a shielding layer on the surface of the semiconductor wafer;

removing a portion of the shielding layer to form an opening within the shielding layer to expose a portion of the third doping region;

forming a doping layer of the second conductivity type on a surface of the third doping region; and performing a self-aligned silicidation process to form a silicide layer on the surfaces of the first doping region, the second doping region, the third doping region, and the doping layer, the silicide layer functioning as a contact region of the vertical bipolar junction transistor.

2. The method of claim 1 wherein said isolated structures are formed by shallow trench isolation (STI).

3. The method of claim 1 wherein said isolated structures are formed by local oxidation of silicon (LOCOS).

4. The method of claim 1 wherein said second doping region more includes at least one heavy doping region of the second conductivity type.

5. The method of claim 1 wherein said shielding layer includes oxide and/or silicon nitride.

6. The method of claim 1 wherein said doping layer is made substantially from epitaxy/amorphous silicon/polysilicon.

7. The method of claim 1 wherein said self-aligned silicidation process further includes forming an SAB layer on the surface of a portion of the doping layer, and forming at least one spacer on the surface of a side of the doping layer before said process.

8. The method of claim 1 wherein said first conductivity type is P-type and said second conductivity type is N-type.

9. The method of claim 1 wherein said first conductivity type is N-type and said second conductivity type is P-type.

10. The method of claim 1 wherein a surface of said semiconductor wafer further includes a CMOS, and a same implant process is performed to form said third doping region and at least one source/drain of the CMOS.

11. The method of claim 1 wherein said doping layer further includes a heavy doping region of the second conductivity type to reduce the resistance of the doping layer.

12. A method for fabricating a vertical bipolar junction transistor on a semiconductor wafer including a first doping region of N-type, a second doping region of P-type, and a plurality of isolated structures positioned on surfaces of the first doping region and the second doping region, the method comprising:

forming a third doping region of N-type in an upper portion of the second doping region;

forming a shielding layer on the surface of the semiconductor wafer; a portion of the shielding layer being removed to form an opening within the shielding layer to expose a portion of the third doping region;

forming a doping layer of P-type on a surface of the third doping region; and performing a self-aligned silicidation process to form a silicide layer on the surfaces of the first doping region, the second doping region, the third doping region, and the doping layer, the silicide layer functioning as a contact region of the vertical bipolar junction transistor.

13. The method of claim 12 wherein said isolated structures are formed by shallow trench isolation (STI).

14. The method of claim 12 wherein said isolated structures are formed by local oxidation of silicon (LOCOS).

15. The method of claim 12 wherein said second doping region more includes at least one heavy doping region of P-type.

16. The method of claim 12, wherein said shielding layer includes oxide and/or silicon nitride.

17. The method of claim 12 wherein said doping layer is made substantially from epitaxy/amorphous silicon/polysilicon.

18. The method of claim 12 wherein said self-aligned silicidation process further includes forming an SAB layer on the surface of a portion of the doping layer, and forming at least one spacer on the surface of a side of the doping layer before said process.

19. The method of claim 12 wherein a surface of said semiconductor wafer further includes a CMOS, and a same implant process is performed to form said third doping region and at least one source/drain of the CMOS.

20. The method claim 12 wherein said doping layer further includes a heavy doping region of P-type to reduce the resistance of the doping layer.

* * * * *

UNITED STATES PATENT AND TRADEMARK OFFICE
CERTIFICATE OF CORRECTION

PATENT NO. : 6,905,935 B1
DATED : June 14, 2005
INVENTOR(S) : Jing-Horng Gau

It is certified that error appears in the above-identified patent and that said Letters Patent is hereby corrected as shown below:

Title page,
Item [73], Assignee, "United Micrelectronics Corp.," should read -- United Microelectronics Corp. --.

Signed and Sealed this

Thirtieth Day of August, 2005

JON W. DUDAS
*Director of the United States Patent and Trademark Office*